(12) United States Patent
Shinohara et al.

(10) Patent No.: US 6,787,900 B2
(45) Date of Patent: Sep. 7, 2004

(54) SEMICONDUCTOR MODULE AND INSULATING SUBSTRATE THEREOF

(75) Inventors: Toshiaki Shinohara, Tokyo (JP); Akira Fujita, Tokyo (JP); Takanobu Yoshida, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/534,043

(22) Filed: Mar. 24, 2000

(65) Prior Publication Data

US 2003/0094682 A1 May 22, 2003

(30) Foreign Application Priority Data

Oct. 27, 1999 (JP) .......................................... P11-305327

(51) Int. Cl.[7] .............................................. H01L 23/34
(52) U.S. Cl. ...................... 257/718; 257/675; 257/703; 257/711; 257/712; 257/718; 257/720; 257/732
(58) Field of Search ................................ 257/675, 676, 257/696, 703, 704, 706, 710–712, 717–720, 732, 735

(56) References Cited

U.S. PATENT DOCUMENTS

| | | | | |
|---|---|---|---|---|
| 4,758,927 A | * | 7/1988 | Berg | 361/761 |
| 5,379,942 A | * | 1/1995 | Kuhnert et al. | 228/106 |
| 5,521,437 A | * | 5/1996 | Oshima et al. | 257/701 |
| 5,638,596 A | * | 6/1997 | McCormick | 29/827 |
| 5,981,036 A | * | 11/1999 | Schulz-Harder et al. | 428/195 |
| 5,982,031 A | * | 11/1999 | Stockmeier | 257/723 |
| 6,011,304 A | * | 1/2000 | Mertol | 257/706 |
| 6,097,101 A | * | 8/2000 | Sato et al. | 257/787 |
| 6,122,170 A | * | 9/2000 | Hirose et al. | 361/704 |
| 6,297,549 B1 | * | 10/2001 | Hiyoshi | 257/703 |
| 6,483,185 B1 | * | 11/2002 | Nagase et al. | 257/706 |

FOREIGN PATENT DOCUMENTS

| | | | | |
|---|---|---|---|---|
| JP | 62287649 A | * | 12/1987 | |
| JP | 05160588 A | * | 6/1993 | |
| JP | 2001035982 A | * | 2/2001 | |

* cited by examiner

*Primary Examiner*—Tom Thomas
*Assistant Examiner*—Chris C. Chu
(74) *Attorney, Agent, or Firm*—Oblon, Spivak, McClelland, Maier & Neustadt, P.C.

(57) ABSTRACT

A semiconductor module (18) includes a ring-shaped metal frame (13) having a bottom surface for contact with a top surface of an external heat sink (11) and serving as a mounting surface. The ring-shaped metal frame (13) has a flange (20) along an inner periphery thereof for engagement with an outer peripheral part of an insulating substrate (17) at a first main surface of a ceramic plate (1). The metal frame (13) is fastened to the external heat sink (11) by screws (12) or bonded to the external heat sink (11) with an adhesive. The flange (20) of the metal frame (13) fastened or bonded to the external heat sink (11) presses the outer peripheral part of the insulating substrate (17) toward the external heat sink (11). This pressing force holds the insulating substrate (17) in pressure contact with the external heat sink (11). The semiconductor module (18) avoids the problem of a decreasing pressing force resulting from deformation to ensure a satisfactory heat dissipating property over a long period of time.

10 Claims, 6 Drawing Sheets

SEMICONDUCTOR MODULE AND INSULATING SUBSTRATE THEREOF

BACKGROUND OF THE INVENTION

1. Field of the Invention

The present invention relates to a power semiconductor module with a semiconductor device such as a power device mounted therein and, more particularly, to a structure of a mounting frame for forcing the semiconductor module into pressure contact with an external heat sink.

2. Description of the Background Art

FIG. 9 is a cross-sectional view of a background art semiconductor module 118 shown as mounted on an external heat sink 111. The semiconductor module 118 comprises: an insulating substrate 117 including a ceramic plate 101, a first metal plate 102 and a second metal plate 103; a semiconductor device 105, such as a power device, mounted on the first metal plate 102 with solder 106; a case 104 having inside electrodes 109 connected through wires 107 to the semiconductor device 105 or the first metal plate 102, the case 104 being made of a thermoplastic resin such as polyphenylene sulfide (PPS) and polybutylene terephthalate (PBT); a resin 108 enclosed and cured in the case 104; and a cover 110 for the case 104.

After silicone grease is applied to a surface of the second metal plate 103 for enhancement of a heat dissipating property, the case 104 and the external heat sink 111 are fastened by screws 112, whereby the pressing force of the case 104 brings the insulating substrate 117 into pressure contact with the external heat sink 111.

In such a background art semiconductor module, the insulating substrate is forced into pressure contact with the external heat sink by the pressing force of the case, and the case is made of a thermoplastic resin. Thus, the case is gradually deformed by creep when used, in particular, continually in a high-temperature environment, and the pressing force of the case exerted upon the insulating substrate decreases with time. As a result, poor contact between the second metal plate and the external heat sink degrades the heat dissipating property.

SUMMARY OF THE INVENTION

A first aspect of the present invention is intended for a semiconductor module mountable on an external heat sink. According to the present invention, the semiconductor module comprises: an insulating substrate for the semiconductor module, the insulating substrate including a substrate, a first conductive pattern formed on a first main surface of the substrate which is on the opposite side from the external heat sink, and a second conductive pattern formed on a second main surface of the substrate which is on the same side as the external heat sink and for contact with the external heat sink; and a mounting frame made of metal and having a mounting surface for contact with the external heat sink, the mounting frame including a flange along a periphery thereof for engagement with a peripheral part of the insulating substrate at the first main surface, the flange pressing the peripheral part of the insulating substrate toward the external heat sink to force the insulating substrate into pressure contact with the external heat sink.

Preferably, according to a second aspect of the present invention, in the semiconductor module of the first aspect, the mounting frame further includes: a first metal plate having the mounting surface; and a second metal plate disposed on the first metal plate and having a protrusion along a periphery thereof projecting from a periphery of the first metal plate to define the flange.

Preferably, according to a third aspect of the present invention, in the semiconductor module of the second aspect, the thickness of the first metal plate is equal to the sum of the thickness of the substrate and the thickness of the second conductive pattern. The thickness of the second metal plate is equal to the thickness of the first metal plate.

Preferably, according to a fourth aspect of the present invention, in the semiconductor module of any one of the first to third aspects, the insulating substrate further includes a third conductive pattern formed on the first main surface along a periphery of the substrate. The flange and the insulating substrate contact each other, with the third conductive pattern therebetween.

Preferably, according to a fifth aspect of the present invention, in the semiconductor module of the fourth aspect, the third conductive pattern is formed partially to allow part of the flange to contact the third conductive pattern. The mounting frame and the insulating substrate are bonded to each other with an adhesive filling a gap between part of the flange which is out of contact with the third conductive pattern and the first main surface.

Preferably, according to a sixth aspect of the present invention, in the semiconductor module of any one of the first to third aspects, the substrate, the first conductive pattern and the second conductive pattern of the insulating substrate have respective peripheries in alignment with each other. The flange presses the periphery of the first conductive pattern toward the external heat sink, with an insulative material between the flange and the first conductive pattern.

Preferably, according to a seventh aspect of the present invention, the semiconductor module of any one of the first to sixth aspects further comprises: a semiconductor device mounted on the first conductive pattern; a cylindrical case disposed on a main surface of the mounting frame which is on the opposite side from the external heat sink; the case, the mounting frame and the insulating substrate defining a space surrounding the semiconductor device; and an insulative sealing material filling the space.

Preferably, according to an eighth aspect of the present invention, in the semiconductor module of the seventh aspect, the sealing material is a thermosetting resin.

A ninth aspect of the present invention is intended for an insulating substrate for a semiconductor module. According to the present invention, the insulating substrate comprises a mounting surface, the mounting surface being adapted to be forced into pressure contact with an external heat sink by a mounting frame pressing a peripheral part of the insulating substrate, the insulating substrate having a curved configuration in which a peripheral part of the mounting surface warps upwardly away from the external heat sink above a central part of the mounting surface.

In accordance with the first aspect of the present invention, the insulating substrate for the semiconductor module is forced into pressure contact with the external heat sink by the pressing force of the metal mounting frame, rather than a conventional case made of a thermoplastic resin. This causes no creep, to avoid the problem of a decreasing pressing force resulting from the deformation of the frame even after continual use in a high-temperature environment. Consequently, the semiconductor module can ensure a satisfactory heat dissipating property over a long period of time.

Additionally, the metal frame has a better heat dissipating property than the conventional case made of the thermoplastic resin. This achieves the size reduction of the semiconductor module.

The production of the flange of the mounting frame by pressing requires various types of manufacturing management such as the management of a pressing tolerance and the management of the flatness of the mounting frame. On the other hand, in the case of the semiconductor module in accordance with the second aspect of the present invention, the management of only the tolerance of the thickness of the first metal plate is required. This facilitates the manufacturing management.

Further, the semiconductor module in accordance with the second aspect of the present invention eliminates the need to machine the flange by pressing to achieve the increase in productivity and the reduction in costs.

In accordance with the third aspect of the present invention, the thickness of the first metal plate is equal to the thickness of the second metal plate. This further facilitates the manufacturing management.

In accordance with the fourth aspect of the present invention, the flange and the insulating substrate contact each other, with the third conductive pattern therebetween. This provides further enhancement of the heat dissipating property and further size reduction of the semiconductor module.

Additionally, the semiconductor module in accordance with the fourth aspect of the present invention can insure uniform stresses applied from the flange through the third conductive pattern to the substrate, suitably preventing cracking in the substrate.

In accordance with the fifth aspect of the present invention, the adhesive may be made as thick as the third conductive pattern. Thus, if a resin in gel form is used as a sealing material for covering a semiconductor device, the adhesive prevents the sealing material from flowing out, providing the highly reliable semiconductor module.

In accordance with the sixth aspect of the present invention, the size of the insulating substrate is reduced in accordance with the elimination of an overhang extended outwardly from the periphery of the first conductive pattern. The size of the semiconductor module itself is accordingly reduced.

In accordance with the seventh aspect of the present invention, the insulative sealing material filling the space provides a mechanical strength and ensures insulation between the metal mounting frame and the semiconductor device.

In accordance with the eighth aspect of the present invention, the insulating substrate is prevented from being broken by an external force applied from the direction of the second conductive pattern, before the semiconductor module is mounted on the external heat sink.

In accordance with the ninth aspect of the present invention, when the peripheral part of the mounting surface is forced into pressure contact with the external heat sink by the mounting frame for the mounting of the insulating substrate on the external heat sink, the central part of the mounting surface is also necessarily brought into pressure contact with the external heat sink. Thus, the ninth aspect of the present invention ensures better contact between the insulating substrate and the external heat sink particularly at the central part of the mounting surface, accomplishing further enhancement of the heat dissipating property.

It is therefore an object of the present invention to provide a semiconductor module and an insulating substrate therefor which can avoid the problem of a decreasing pressing force resulting from deformation to ensure a satisfactory heat dissipating property over a long period of time.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a cross-sectional view of the semiconductor module shown as mounted on the external heat sink according to a second preferred embodiment of the present invention;

DESCRIPTION OF THE PREFERRED EMBODIMENTS

First Preferred Embodiment

Figure 1:
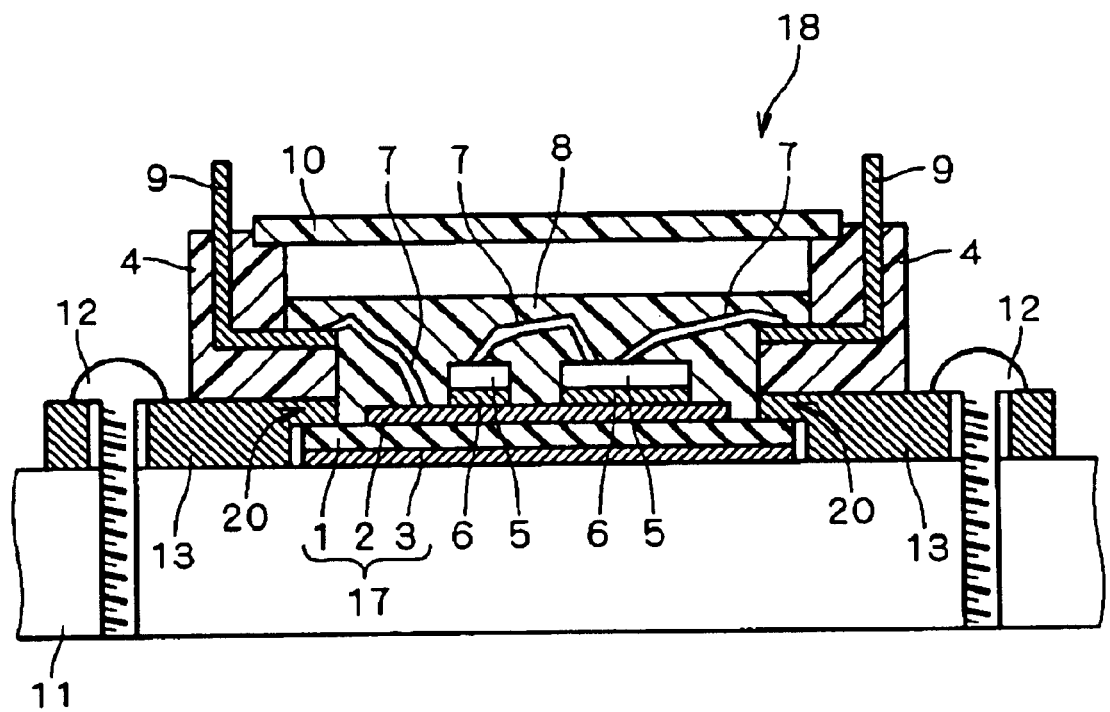
FIG. 1 is a cross-sectional view of a semiconductor module shown as mounted on an external heat sink according to a first preferred embodiment of the present invention.

FIG. 1 is a cross-sectional view of a semiconductor module 18 shown as mounted on an external heat sink 11 according to a first preferred embodiment of the present invention. The semiconductor module 18 comprises an insulating substrate 17 for a semiconductor module. The insulating substrate 17 includes a ceramic plate 1, a first metal plate 2 formed on a first main surface of the ceramic plate 1 which is on the opposite side from the external heat sink 11, and a second metal plate 3 formed on a second main surface of the ceramic plate 1 which is on the same side as the external heat sink 11 and for contact with the external heat sink 11.

The semiconductor module 18 further comprises a ring-shaped metal frame 13 having a bottom surface for contact with the top surface of the external heat sink 11 and serving as a mounting surface. The ring-shaped metal frame 13 has a flange 20 along an inner periphery thereof for engagement with an outer peripheral part of the insulating substrate 17 at the first main surface of the ceramic plate 1. The metal frame 13 is fastened to the external heat sink 11 by screws 12 or bonded to the external heat sink 11 with an adhesive. The flange 20 of the metal frame 13 fastened or bonded to the external heat sink 11 presses the outer peripheral part of the insulating substrate 17 toward the external heat sink 11. This pressing force holds the insulating substrate 17 in pressure contact with the external heat sink 11.

The semiconductor module 18 further comprises a semiconductor device 5, such as a power device, mounted on the first metal plate 2 with solder 6, and a cylindrical hollow case 4 bonded to or fastened by screws to a main surface of the metal frame 13 which is on the opposite side from the external heat sink 11. The case 4 is made of a thermoplastic resin such as PPS and PBT, and electrodes 9 are disposed inside the case 4. The electrodes 9 are connected to the semiconductor device 5 or the first metal plate 2 through wires 7 such as aluminum fine lines.

The side surface of the case 4, the side surface of the flange 20 of the metal frame 13 and the top surface of the insulating substrate 17 define a space surrounding the semiconductor device 5. This space is filled with an insulative sealing material 8 which covers at least the semiconductor device 5 and the wires 7. This provides a mechanical strength and ensures insulation between the metal frame 13, the semiconductor device 5 and the wires 7. An example of the sealing material 8 used herein may include a thermosetting resin such as epoxy-based resin. Alternatively, silicone gel may be used as the sealing material 8 when the mechanical strength is sufficiently high. A cover 10 is bonded to or fastened by screws to the case 4, as required.

In the semiconductor module 18 according to the first preferred embodiment of the present invention, as described hereinabove, the insulating substrate 17 is forced into pressure contact with the external heat sink 11 by the pressing force of the metal frame 13, rather than the background art case 104 made of the thermoplastic resin. This causes no creep, to avoid the problem of the decreasing pressing force resulting from the deformation of the metal frame 13 even after continual use in a high-temperature environment. Consequently, the semiconductor module 18 can ensure a satisfactory heat dissipating property over a long period of time.

Additionally, the metal frame 13 has a better heat dissipating property than the background art case 104 made of the thermoplastic resin. This achieves the size reduction of the semiconductor module.

Furthermore, when the thermosetting resin is used as the sealing material 8, the insulating substrate 17 is prevented from being broken by an external force applied from the direction of the second metal plate 3 before the semiconductor module 18 is mounted on the external heat sink 11.

Second Preferred Embodiment

Figure 2A:
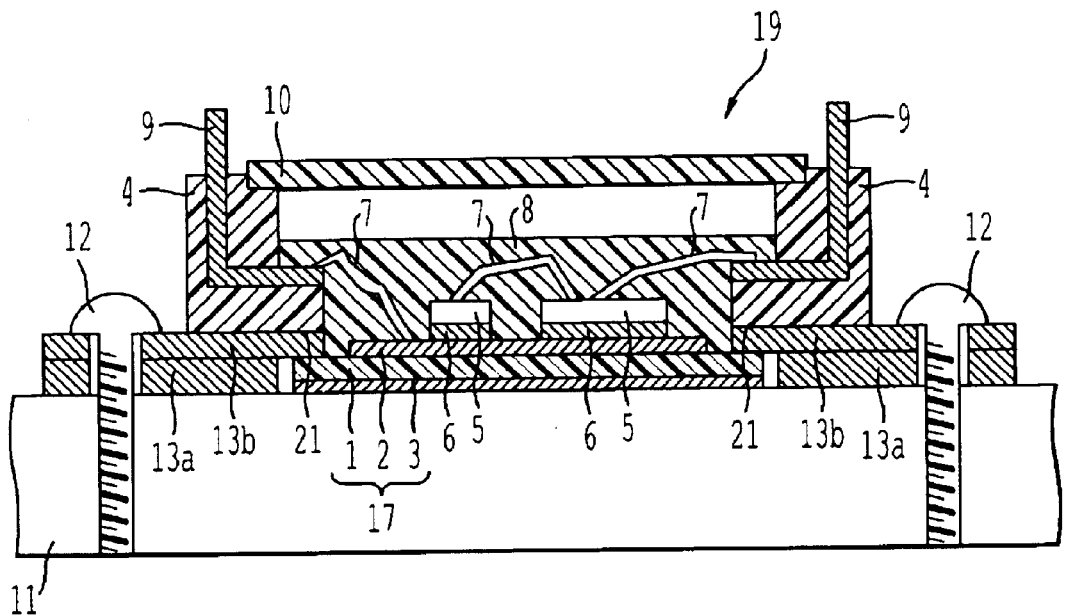
FIG. 2A is a cross-sectional view of the semiconductor module shown as mounted on the external heat sink according to a preferred embodiment of the present invention.

FIG. 2A is a cross-sectional view of a semiconductor module 19 shown as mounted on the external heat sink 11 according to a second preferred embodiment of the present invention. The semiconductor module 19 comprises a double-layer structure including a lower metal plate 13a having a mounting surface for contact with the external heat sink 11 and an upper metal plate 13b secured on the lower metal plate 13a, in place of the metal frame 13 shown in FIG. 1. The inner periphery of the upper metal plate 13b projects inwardly from the inner periphery of the lower metal plate 13a to define a protrusion 21 corresponding to the flange 20 shown in FIG. 1.

Figure 2B:
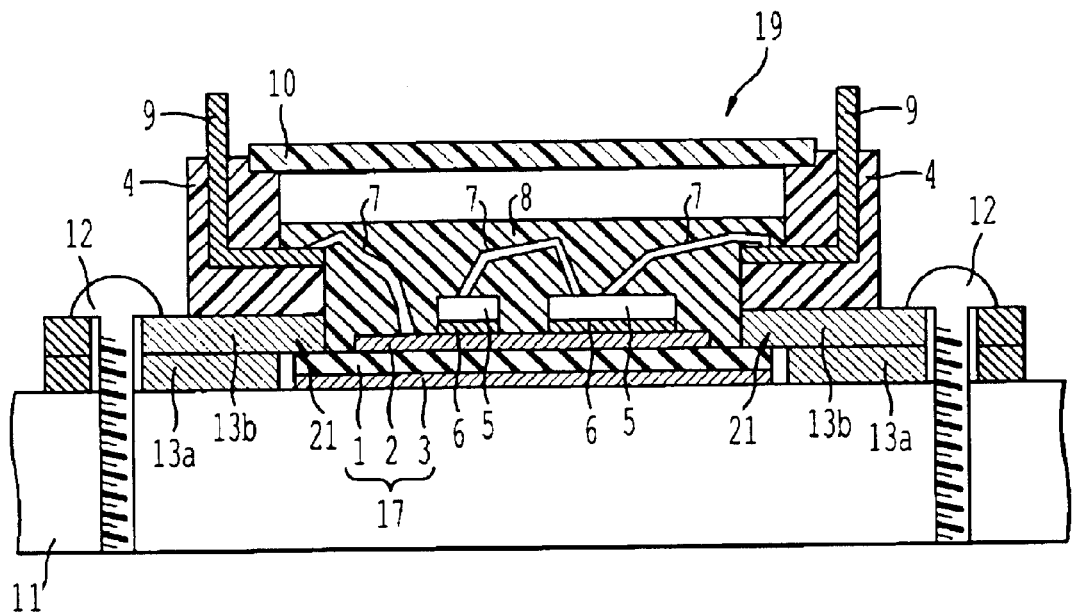
FIG. 2B is a cross-sectional view of the semiconductor module shown as mounted on the external heat sink according to another embodiment of the present invention wherein first and second metal plates of the mounting frame are shown to be of equal thickness.

The thickness of the lower metal plate 13a is equal to the sum of the thickness of the ceramic plate 1 and the thickness of the second metal plate 3. The upper metal plate 13b may be of any thickness, but is preferably as thick as the lower metal plate 13a, as shown in FIG. 2B, in consideration for the ease of manufacturing management. The remaining structure of the semiconductor module 19 according to the second preferred embodiment is identical with the corresponding structure of the semiconductor module 18 of the first preferred embodiment in FIG. 1.

As described hereinabove, the semiconductor module 19 according to the second preferred embodiment comprises the double-layer structure including the lower metal plate 13a and the upper metal plate 13b, in place of the metal frame 13 shown in FIG. 1. The production of the flange 20 of the metal frame 13 shown in FIG. 1 by pressing requires various types of manufacturing management such as the management of a pressing tolerance and the management of the flatness of the metal frame 13. On the other hand, in the case of the semiconductor module 19 according to the second preferred embodiment, the management of only the tolerance of the thickness of the lower metal plate 13a is required. This facilitates the manufacturing management.

Further, the second preferred embodiment eliminates the need to machine the flange 20 by pressing to achieve the increase in productivity and the reduction in costs.

Third Preferred Embodiment

Figure 3:
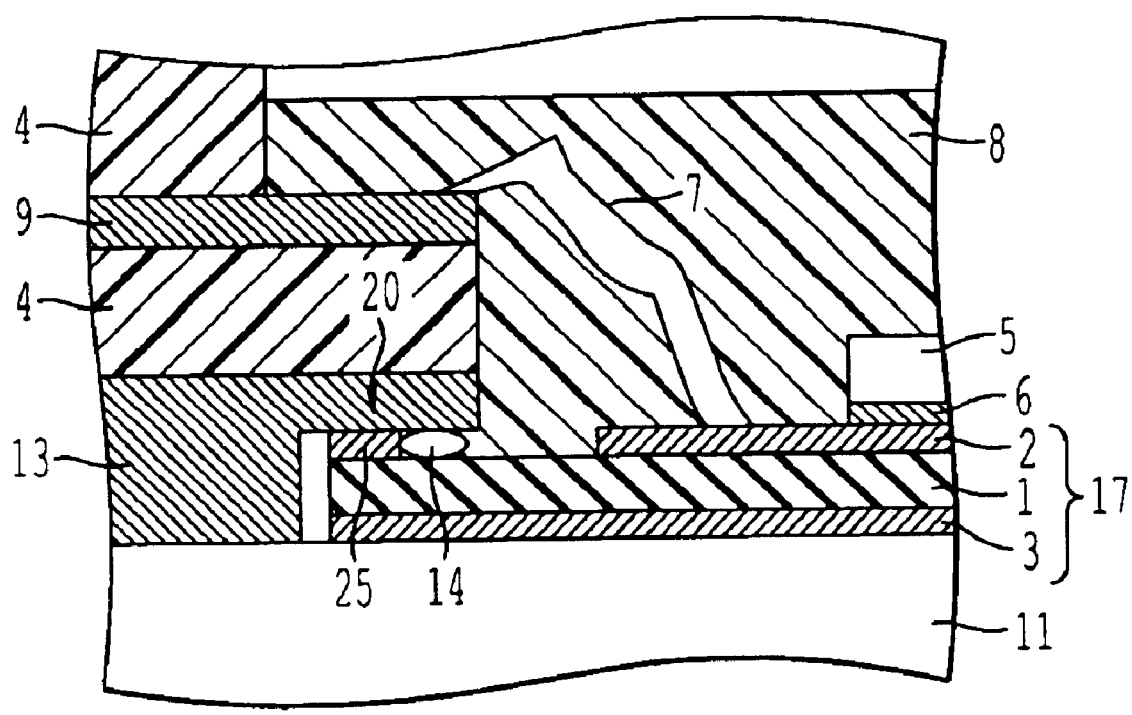
FIG. 3 is an enlarged cross-sectional view of part of a structure of the semiconductor module shown as mounted on the external heat sink according to a third preferred embodiment of the present invention.

FIG. 3 is an enlarged cross-sectional view of part of a structure of the semiconductor module shown as mounted on the external heat sink 11 according to a third preferred embodiment of the present invention. The semiconductor module according to the third preferred embodiment shown in FIG. 3 comprises a third metal plate 25 formed on the first main surface of the ceramic plate 1 along the outer periphery of the ceramic plate 1. The flange 20 of the metal frame 13 and the ceramic plate 1 are in contact with each other, with the third metal plate 25 therebetween.

The third metal plate 25 is formed partially so that part of the flange 20 contacts the third metal plate 25. The metal frame 13 and the insulating substrate 17 are bonded to each other with an adhesive 14 filling the gap between the flange 20 and the ceramic plate 1.

Figure 4:
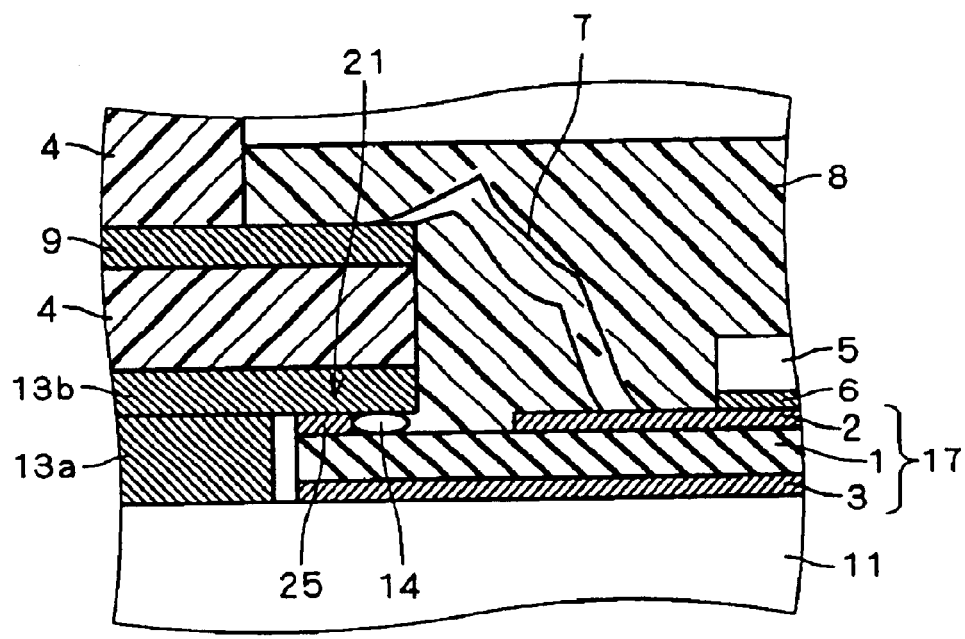
FIG. 4 is an enlarged cross-sectional view of part of another structure of the semiconductor module shown as mounted on the external heat sink according to the third preferred embodiment of the present invention.

Although the third preferred embodiment of the present invention is applied to the semiconductor module 18 of the first preferred embodiment in the above description, the third preferred embodiment may be applied to the semiconductor module 19 of the second preferred embodiment, as illustrated in FIG. 4. The remaining structure of the semiconductor module according to the third preferred embodiment is identical with the corresponding structure of the semiconductor modules 18 and 19.

In the semiconductor module according to the third preferred embodiment, as described hereinabove, the metal frame 13 or the upper metal plate 13b and the ceramic plate 1 are in contact with each other, with the third metal plate 25 therebetween. This provides further enhancement of the heat dissipating property and further size reduction of the semiconductor module.

Additionally, the third preferred embodiment can insure uniform stresses applied from the flange 20 or the protrusion 21 through the third metal plate 25 to the ceramic plate 1, suitably preventing cracking in the ceramic plate 1.

Further, the adhesive 14 may be made as thick as the third metal plate 25. Thus, if a resin in gel form is used as the sealing material 8, the adhesive 14 prevents the sealing material 8 from flowing out, providing the highly reliable semiconductor module.

Fourth Preferred Embodiment

Figure 5:
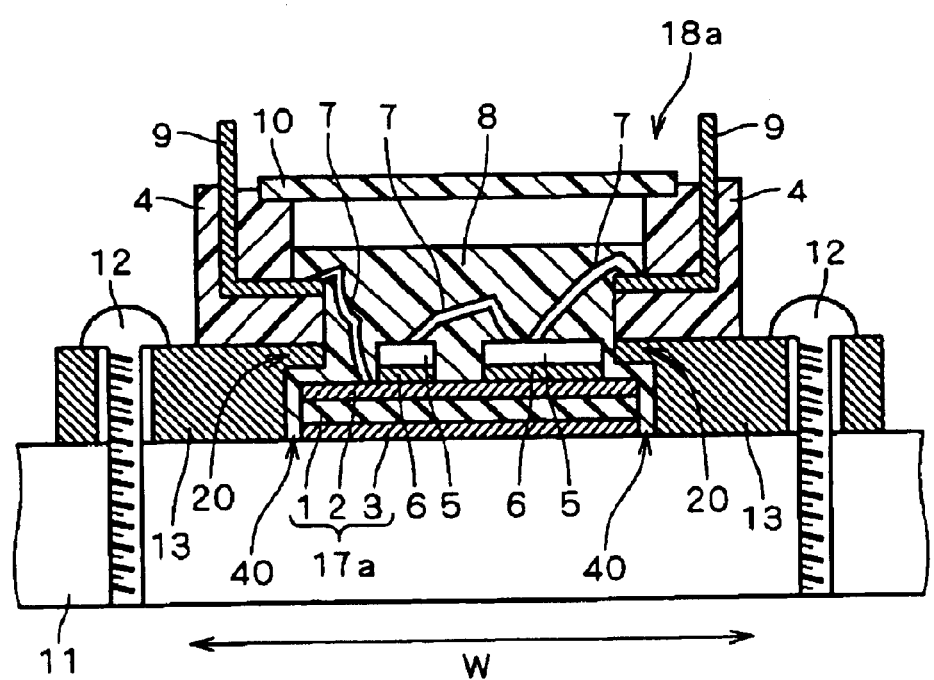
FIG. 5 is a cross-sectional view of the semiconductor module shown as mounted on the external heat sink according to a fourth preferred embodiment of the present invention.

FIG. 5 is a cross-sectional view of a semiconductor module 18a shown as mounted on the external heat sink 11 according to a fourth preferred embodiment of the present invention. In the semiconductor module 18 shown in FIG. 1, for instance, the ceramic plate 1 has a peripheral overhang extended outwardly from the outer periphery of the first metal plate 2 so as to prevent the contact between the flange 20 of the metal frame 13 and the first metal plate 2 of the insulating substrate 17. In the semiconductor module 18a according to the fourth preferred embodiment, on the other hand, the peripheral overhang of the ceramic plate 1 is dispensed with so that the outer peripheries of the first metal plate 2 and the ceramic plate 1 are in alignment with each other. Additionally, the outer periphery of the second metal plate 3 is aligned with the outer periphery of the ceramic plate 1.

To prevent the metal frame 13 from contacting the first and second metal plates 2 and 3, a gap 40 is produced between the metal frame 13 and an insulating substrate 17a so that the insulative sealing material 8 flows also into the gap 40. As a result, the flange 20 of the metal frame 13 fastened by the screws to the external heat sink 11 presses the outer peripheral part of the first metal plate 2 toward the external heat sink 11, with the sealing material 8 between the flange 20 and the first metal plate 2. This pressing force holds the insulating substrate 17a in pressure contact with the external heat sink 11.

Although the fourth preferred embodiment of the present invention is applied to the semiconductor module 18 of the first preferred embodiment in the above description, the fourth preferred embodiment may be applied to the semiconductor module 19 of the second preferred embodiment.

In the semiconductor module 18a according to the fourth preferred embodiment, as described hereinabove, the outer peripheries of the ceramic plate 1 and the second metal plate 3 are aligned alignment with the outer periphery of the first metal plate 2. This reduces the size of the insulating substrate 17a in accordance with the elimination of the peripheral overhang, to accordingly reduce the width W of the semiconductor module 18a itself.

Fifth Preferred Embodiment

Figure 6:
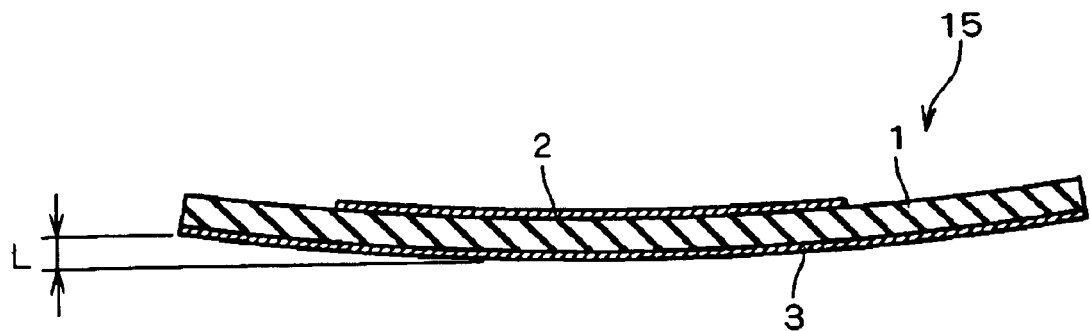
FIG. 6 is a cross-sectional view of a structure of an insulating substrate for the semiconductor module according to a fifth preferred embodiment of the present invention.

FIG. 6 is a cross-sectional view of a structure of an insulating substrate 15 for a semiconductor module according to a fifth preferred embodiment of the present invention. The ceramic plate 1, the first metal plate 2 and the second metal plate 3 of the insulating substrate 15 having the structure based on the insulating substrate 17 shown in FIGS. 1 and 2A are of a curved configuration such that the outer peripheral part of the mounting surface for contact with the external heat sink 11 warps upwardly away from the external heat sink 11 a distance L (ranging from 0 to 300 μm) above the central part thereof.

Figure 7:
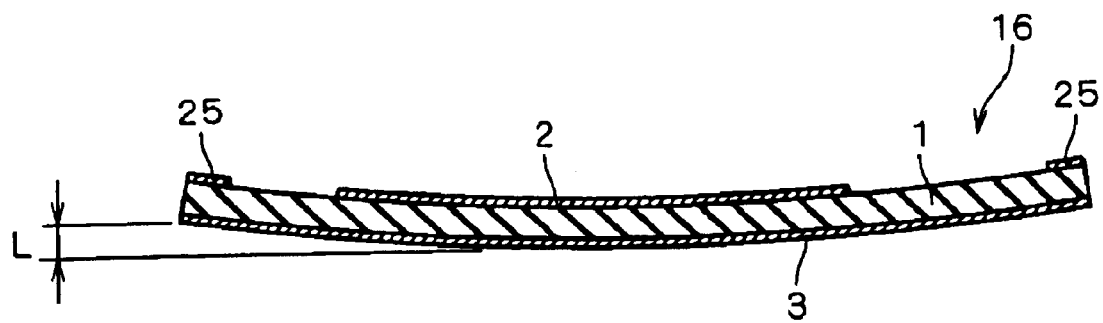
FIG. 7 is a cross-sectional view of a structure of the insulating substrate for the semiconductor module according to a first modification of the fifth preferred embodiment of the present invention.

FIG. 7 is a cross-sectional view of a structure of an insulating substrate 16 for a semiconductor module according to a modification of the fifth preferred embodiment of the present invention. The ceramic plate 1, the first metal plate 2, the second metal plate 3 and the third metal plate 25 of the insulating substrate 16 having the structure based on the insulating substrate 17 shown in FIGS. 3 and 4 are of a curved configuration such that the outer peripheral part of the mounting surface warps upwardly away from the external heat sink 11 in a manner similar to the insulating substrate 15.

Figure 8:
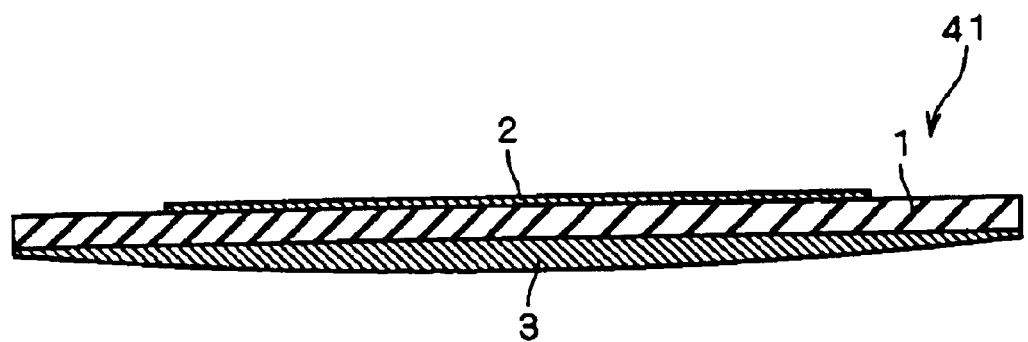
FIG. 8 is a cross-sectional view of a structure of the insulating substrate for the semiconductor module according to a second modification of the fifth preferred embodiment of the present invention.
Figure 9:
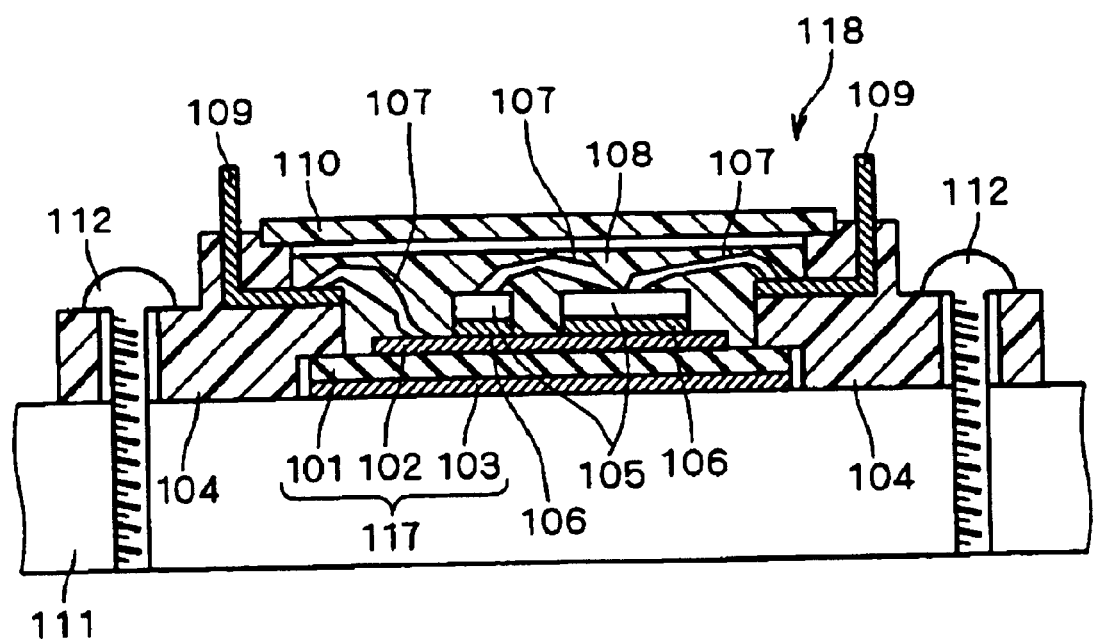
FIG. 9 is a cross-sectional view of a background art semiconductor module shown as mounted on an external heat sink.

The ceramic plate 1, the first metal plate 2, the second metal plate 3 and the third metal plate 25 are illustrated as curved together in the above description. Alternatively, an insulating substrate 41 as shown in FIG. 8 may be provided in which only the bottom surface of the second metal plate 3 is curved convexedly. Furthermore, the fifth preferred embodiment according to the present invention may be applied to the insulating substrate 17a of the fourth preferred embodiment.

As described hereinabove, the insulating substrates 15, 16 and 41 according to the fifth preferred embodiment are shaped such that the outer peripheral part of the mounting surface warps upwardly away from the external heat sink 11 above the central part thereof, before the mounting on the external heat sink 11. When the outer peripheral part of the mounting surface is forced into pressure contact with the external heat sink 11 by the pressing force of the flange 20 or the protrusion 21 for the mounting of the semiconductor module on the external heat sink 11, the central part of the mounting surface is also necessarily brought into pressure contact with the external heat sink 11. Thus, the insulating substrates 15, 16 and 41 according to the fifth preferred embodiment ensure better contact with the external heat sink 11 particularly at the central part of the mounting surface than the insulating substrates 17 and 17a according to the first to fourth preferred embodiments, accomplishing further enhancement of the heat dissipating property.

While the invention has been described in detail, the foregoing description is in all aspects illustrative and not restrictive. It is understood that numerous other modifications and variations can be devised without departing from the scope of the invention.

What is claimed is:

1. A semiconductor module mountable on an external heat sink, said semiconductor module comprising:

an insulating substrate for said semiconductor module, said insulating substrate including a substrate, a first conductive pattern formed on a first main surface of said substrate which is on the opposite side from said external heat sink, and a second conductive pattern formed on a second main surface of said substrate which is on the same side as said external heat sink and for contact with said external heat sink; and a mounting frame made of metal and having a mounting surface for direct contact with said external heat sink, said mounting frame including a flange along a periphery thereof for engagement with a peripheral part of said insulating substrate at said first main surface, said flange pressing said peripheral part of said insulating substrate toward said external heat sink to force said insulating substrate into pressure contact with said external heat sink, wherein said mounting frame further includes:

a first metal plate having said mounting surface, and a second metal plate disposed directly on and in contact with said first metal plate and having a protrusion along a periphery thereof projecting from a periphery of said first metal plate to define said flange.

2. The semiconductor module according to claim 1, wherein the thickness of said first metal plate is equal to the sum of the thickness of said substrate and the thickness of said second conductive pattern; and wherein the thickness of said second metal plate is equal to the thickness of said first metal plate.

3. The semiconductor module according to claim 1,
wherein said insulating substrate further includes a third conductive pattern formed on said first main surface along a periphery of said substrate; and
wherein said flange and said insulating substrate contact each other, with said third conductive pattern therebetween.

4. The semiconductor module according to claim 3,
wherein said third conductive pattern is formed partially to allow part of said flange to contact said third conductive pattern; and
wherein said mounting frame and said insulating substrate are bonded to each other with an adhesive filling a gap between part of said flange which is out of contact with said third conductive pattern and said first main surface.

5. A semiconductor module mountable on an external heat sink, said semiconductor module comprising:
an insulating substrate for said semiconductor module, said insulating substrate including a substrate, a first conductive pattern formed on a first main surface of said substrate which is on the opposite side from said external heat sink, and a second conductive pattern formed on a second main surface of said substrate which is on the same side as said external heat sink and for contact with said external heat sink; and
a mounting frame made of metal and having a mounting surface for contact with said external heat sink, said mounting frame including a flange along a periphery thereof for engagement with a peripheral part of said insulating substrate at said first main surface, said flange pressing said peripheral part of said insulating substrate toward said external heat sink to force said insulating substrate into pressure contact with said external heat sink,
wherein said insulating substrate further includes a third conductive pattern formed on said first main surface along a periphery of said substrate,
wherein said flange and said insulating substrate contact each other, with said third conductive pattern therebetween,
wherein said third conductive pattern is formed partially to allow part of said flange to contact said third conductive pattern, and
wherein said mounting frame and said insulating substrate are bonded to each other with an adhesive filling a gap between part of said flange which is out of contact with said third conductive pattern and said first main surface.

6. A semiconductor module mountable on an external heat sink, said semiconductor module comprising:
an insulating substrate for said semiconductor module, said insulating substrate including a substrate, a first conductive pattern formed on a first main surface of said substrate which is on the opposite side from said external heat sink, and a second conductive pattern formed on a second main surface of said substrate which is on the same side as said external heat sink and for contact with said external heat sink; and
a mounting frame made of metal and having a mounting surface for contact with said external heat sink, said mounting frame including a flange along a periphery thereof for engagement with a peripheral part of said insulating substrate at said first main surface, said flange pressing said peripheral part of said insulating substrate toward said external heat sink to force said insulating substrate into pressure contact with said external heat sink,
wherein said substrate, said first conductive pattern and said second conductive pattern of said insulating substrate have respective peripheries in alignment with each other;
wherein said flange presses said periphery of said first conductive pattern on which a semiconductor element is mounted toward said external heat sink, with an insulative material between said flange and said first conductive pattern; and
wherein a part pressed by said flange with said insulative material therebetween and a part on which said semiconductor element is mounted are physically continuous with each other in said first conductive pattern.

7. An insulating substrate for a semiconductor module, said insulating substrate comprising a mounting surface, said mounting surface being adapted to be forced into pressure contact with an external heat sink by a mounting frame pressing a peripheral part of said insulating substrate,
said insulating substrate having a curved configuration in which a peripheral part of said mounting surface warps upwardly away from said external heat sink above a central part of said mounting surface,
said insulating substrate further comprising:
a substrate;
a first conductive pattern formed on a first main surface of said substrate which is on the opposite side from said external heat sink; and
a second conductive pattern formed on a second main surface of said substrate which is on the same side as said external heat sink and having a bottom surface serving as said mounting surface,
wherein only the bottom surface of said second conductive pattern is curved because of a difference in thickness between a central part of said second conductive pattern and a peripheral part thereof.

8. The insulating substrate according to claim 7, wherein said peripheral part of said second conductive pattern has a thickness smaller than said central part of said second conductive pattern.

9. A semiconductor module, mountable on an external heat sink, said semiconductor module comprising:
an insulating substrate for said semiconductor module, said insulating substrate including a substrate, a first conductive pattern formed on a first main surface of said substrate which is on the opposite side from said external heat sink, and a second conductive pattern formed on a second main surface of said substrate which is on the same side as said external heat sink and for contact with said external heat sink; and
a mounting frame made of metal and having a mounting surface for contact with said external heat sink, said mounting frame including a flange along a periphery thereof for engagement with a peripheral part of said insulating substrate at said first main surface, said flange pressing said peripheral part of said insulating substrate toward said external heat sink to force said insulating substrate into pressure contact with said external heat sink,
wherein said mounting frame further includes:
a first metal plate having said mounting surface, and
a second metal plate disposed directly on and in contact with said first metal plate and having a protrusion along a periphery thereof projecting from a periphery of said first metal plate to define a flange;

wherein the thickness of said first metal plate is equal to the sum of the thickness of said substrate and the thickness of said second conductive pattern; and wherein the thickness of said second metal plate is equal to the thickness of said first metal plate.

10. A semiconductor module mountable on an external heat sink, said semiconductor module comprising:

an insulating substrate for said semiconductor module, said insulating substrate including a substrate, a first conductive pattern formed on a first main surface of said substrate which is on the opposite side from said external heat sink, and a second conductive pattern formed on a second main surface of said substrate which is on the same side as said external heat sink and for contact with, said external heat sink; and a mounting frame made of metal and having a mounting surface for contact with said external heat sink, said mounting frame including a flange along a periphery thereof for engagement with a peripheral part of said insulating substrate at said first main surface, said flange pressing said peripheral part of said insulating substrate toward said external heat sink to force said insulating substrate into pressure contact with said external heat sink, wherein said mounting frame further includes:

a first metal plate having said mounting surface, and a second metal plate disposed directly on and in contact with said first metal plate and having a protrusion along a periphery thereof projecting from a periphery of said first metal plate to define a flange;

wherein said insulating substrate further includes a third conductive pattern formed on said first main surface along a periphery of said substrate;

wherein said flange and said insulating substrate contact each other, with said third conductive pattern therebetween;

wherein said third conductive pattern is formed partially to allow part of said flange to contact said third conductive pattern; and wherein said mounting frame and said insulating substrate are bonded to each other with an adhesive filling a gap between part of said flange which is out of contact with said third conductive pattern and said first main surface.

* * * * *